United States Patent [19]

Tewksbury

[11] Patent Number: 4,472,727
[45] Date of Patent: Sep. 18, 1984

[54] CARRIER FREEZEOUT FIELD-EFFECT DEVICE

[75] Inventor: Stuart K. Tewksbury, Middletown, N.J.

[73] Assignee: AT&T Bell Laboratories, Murray Hill, N.J.

[21] Appl. No.: 550,506

[22] Filed: Nov. 10, 1983

Related U.S. Application Data

[63] Continuation of Ser. No. 522,487, Aug. 12, 1983, abandoned.

[51] Int. Cl.³ ............................................. H01L 29/78
[52] U.S. Cl. .................................... 357/23.1; 357/83; 357/63; 357/41; 307/306; 307/245
[58] Field of Search .................... 357/23.1, 83, 63, 41; 307/306, 245

[56] References Cited

U.S. PATENT DOCUMENTS

| | | | |
|---|---|---|---|
| 3,500,137 | 3/1970 | Schroen et al. | 357/83 |
| 3,502,908 | 3/1970 | Christensen | 357/23.1 X |
| 3,512,012 | 5/1970 | Kosowsky et al. | 357/23.1 X |
| 3,644,803 | 2/1972 | Levi | 357/23.1 X |
| 4,129,880 | 12/1978 | Vinal | 357/23.1 X |

FOREIGN PATENT DOCUMENTS 20485  2/1982  Japan ..................................... 357/83

OTHER PUBLICATIONS

Crowder et al, "Five-Terminal High-Performance MOSFET with Electrically Controllable Channel Length," *IBM Tech. Discl. Bull.*, vol. 19, No. 7, Dec. '76, 2787.

Primary Examiner—Martin H. Edlow
Assistant Examiner—William A. Mintel
Attorney, Agent, or Firm—Volker R. Ulbrich

[57] ABSTRACT

A buried-channel MOSFET device 10 is cooled sufficiently to experience majority carrier freezeout in the channel region 30 (e.g. 10° k.). It is appropriately fabricated and biased to form a buried-channel 40. When the gate 26 is pulsed, there appears in the buried channel 40 a transient conducting condition which lasts for on the order of $10^{-8}$ second or more and may therefore be used for subnanosecond switching functions. The switching energy needed for turning the device 10 on is very low, of the same order of magnitude as for Josephson junction devices. Turn-on is dependent mostly on the height of the switching pulse, rather than upon a voltage threshold relative to the source voltage. This makes possible a large scale integration of such devices with the same switching voltage as that required for a single device.

13 Claims, 3 Drawing Figures

CARRIER FREEZEOUT FIELD-EFFECT DEVICE

CROSS-REFERENCES TO RELATED APPLICATIONS

This is a continuation of application Ser. No. 522,487 filed Aug. 12, 1983, now abandoned.

TECHNICAL FIELD

The invention relates generally to semiconductor high-speed electronic switching devices for integrated circuits and relates more particularly to field-effect transistors.

BACKGROUND OF THE INVENTION

Very large scale integrated (VLSI) circuits, such as microprocessors, require low power dissipation logic gates to avoid excessive power dissipation in the overall circuit. However, the power dissipation and switching delays are coupled according to their product, the power-delay product, which is set mainly by device (i.e. feature) size and voltage swing. Current VLSI MOSFET (metal-oxide-semiconductor field-effect transistor) devices typically operate at about 5 volts, and for about 1 μm feature sizes the power-delay product is about 100 femtojoule (1 femtojoule = $10^{-15}$ joule). This, combined with power dissipation of about 1 μW (microwatt) per device, limits switching delays to greater than about 10 nsec. (nanoseconds). Alternatively, MOSFETs can be designed to produce approximately 50 psec. (picosecond) delays, but the power dissipation increases to about 1 mW per device. Such a dissipation value is too high to make feasible the large number of devices needed in VLSI circuits.

There is a need for a switching device that can operate simultaneously at high speed (e.g. <1 nsec) and low power (e.g. $\leq$1 μW), corresponding to a $\leq$1 femtojoule power delay product. Since feature sizes are approaching basic limits on minimum size, such a reduction in power-delay product can be achieved only by greatly reducing voltage swings. However, rather stringent practical limits on voltage swings in current VLSI MOSFET devices and operation at room temperature prevent the use of such low voltages.

SUMMARY OF THE INVENTION

In accordance with the present invention, a buried channel field-effect device is adapted to have majority carrier freezeout in the channel region (and, coincidentally, in the substrate). The device is biased and the gate voltage is pulsed. This generates a transient conductance in the buried channel in response to the pulse.

The switching pulse voltage needed for generating the transient conductivity is sufficiently low to permit high-speed switching. The static transconductance of the channel region is very low due to the freezing out of carriers and the absence of surface conductivity effects. The transient conductivity response of the buried channel to the switching pulses does not depend upon an absolute voltage threshold, but rather, over a substantial range of about one volt or more of absolute gate voltage is dependent upon the pulse voltage differential. As a result, an integrated circuit containing large numbers of such devices will not show a sensitivity to variations either in the absolute voltages appearing at individual devices or to device-to-device variations in the devices' threshold voltages. By operating devices at low temperature and providing a dynamic switch based on non-equilibrium processes in the semiconductor, the invention described here achieves the potential for switching voltages as low as 25 mvolt (millivolts) and power-delay products as small as a few atojoule (ato = $10^{-18}$) compatible with the practical voltage sensitivity limits of VLSI circuits.

DETAILED DESCRIPTION

Figure 1:
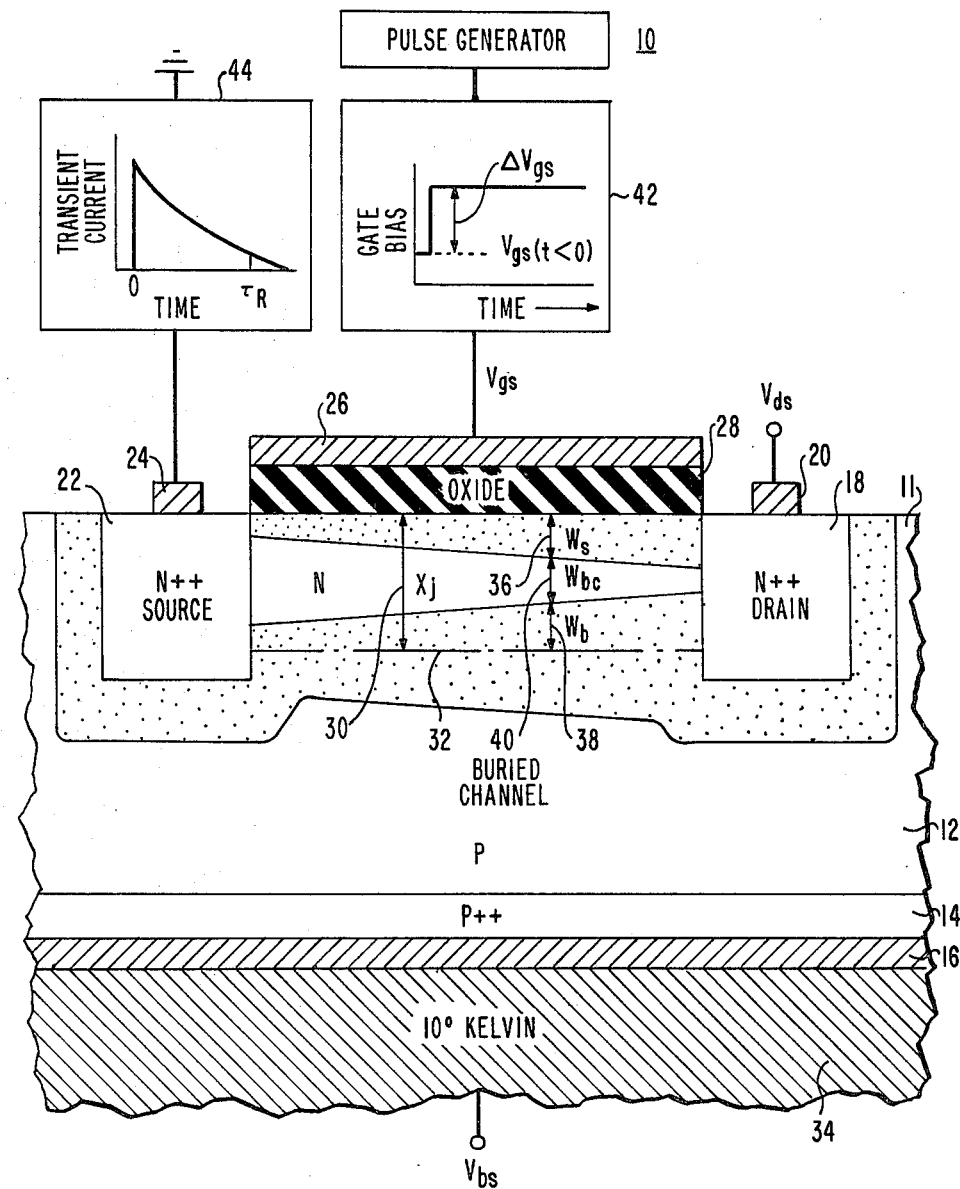
FIG. 1 is an exaggerated, schematic, front, sectional view of a fragment of a circuit including a buried channel MOSFET in accordance with one embodiment of the present invention.

One embodiment of the present invention is the device 10 of FIG. 1, which includes an N-channel, buried channel MOSFET 11. The MOSFET 11 includes a P-type conductivity boron-doped silicon substrate 12 having at one surface a heavily doped $P^{++}$ conductive region 14 overlaid with a metal substrate bias electrode 16. The substrate 12 has a (100) Miller index plane orientation and a conductivity of 8 ohm-centimeters. In the opposite surface of the substrate 12 there is formed a conductive $N^{++}$ drain region 18 to which there is attached an ohmic contact 20. Spaced from this drain region 18 there is an $N^{++}$ conductive source region 22 to which there is attached an ohmic contact 24. Over the surface of the substrate 12 between the source 22 and the drain 18 there is a metal gate electrode 26 separated from the substrate 12 by an oxide insulating layer 28. A channel region 30 is formed in the surface region of the substrate 12 to a depth of xj between the drain 18 and source 22 by the addition of a compensating N-type dopant or growth of an N-type surface layer to make that region N-type conductivity. This results in a P-N junction 32 within the substrate 12 between the drain 18 and the source 22. A channel region 30 surface N-type layer about 0.5 μm thick with a volume resistivity of about 0.2 ohm-centimeters ensures formation of a field-free buried channel region.

The MOSFET device 11 is placed in intimate contact with a cooled body 34 which maintains its temperature at less than about 30 degrees Kelvin. This results in the freezing out of virtually all the majority carriers (electrons) in the channel region 30 to make it semi-insulating.

It is known to design circuits with ordinary MOSFET's to operate at 77 degrees Kelvin, which is the temperature of boiling nitrogen at standard pressure. At this temperature, these devices operate with increased efficiency, due in large part to higher carrier mobility. However, the underlying device mechanisms are otherwise similar to those which are active in such a device at 300 degrees Kelvin, or room temperature. When a MOSFET is cooled to a lower temperature, less than about 30 degrees Kelvin, carrier freezeout becomes prominent. Dopant impurities are generally in the equilibrium neutral charge state, rather than the ionized charge state, and field-free regions of the device are semi-insulating. Rather than responding at the dielectric relaxation rate, as at higher temperatures, impurity charge responds to changes in potential at the slower carrier capture and emission rates. The source and drain regions of a MOSFET can rapidly supply mobile carriers to compensate for the slower response of impurity charge. This produces a transient conductance effect in freezeout which is a consequence of non-equilibrium conditions during relaxation of the ionized impurity charge. This conductance transient in freezeout relaxes as the width of the surface depletion layer contracts to its new equilibrium width by neutralizing donor atoms in the surface depletion layer through majority carrier capture processes. The relaxation time is slow relative to subnanosecond switching times, with typical relaxation times of greater than about $10^{-8}$ seconds. However, relaxation may not start until majority carriers are present. Therefore, the conductance necessarily precedes the surface depletion layer (and conductance) relaxation.

When the MOSFET 11 is appropriately biased (e.g. the gate-source voltage $V_{gs}$ is about 0 volts, the drain-source voltage $V_{ds}$ is about 25 millivolts, the substrate bias-source voltage $V_{bs}$ is about 0 volts), a surface depletion region 36 with a thickness $W_s$ and an interior depletion region 38 with a thickness $W_b$ are formed within the N-type channel region 30. The depletion regions 36, 38 are separated by a field-free buried conduction channel 40 having a thickness $W_{bc}$.

When the bias voltage $V_{gs}$ of the gate 26 is pulsed by $\Delta V_{gs}$, as shown schematically in box 42, a transient conductivity, shown schematically in box 44, arises in the buried channel 40. The transient conductivity is believed to be due to mobile carriers migrating into the buried channel 40 from the source 22 and drain 18 because of the sudden field which arises in the buried channel 40 in response to the switching pulse. The impurity atoms of the surface depletion layer are fully ionized. After the majority carriers are injected into buried channel 40, those near the surface depletion layer 36 edge are captured by ionized donors, neutralizing the donor atoms at the depletion layer 36 edge and causing the surface depletion layer 36 width $W_s$ to contract. As the majority carriers are trapped, the conductivity decreases until all have been trapped (i.e. conductivity goes to zero). When the gate voltage $V_{gs}$ is restored to its original value, the surface depletion layer 36 expands back to its original width $W_s$ by the much slower process of carrier emission. For stability, the gate pulse width should be small compared to the capture time, i.e. about one nanosecond or less. The conductance returns to zero (when the gate bias is restored) very rapidly via carrier extraction through the source 22 and drain 18.

Figure 2:
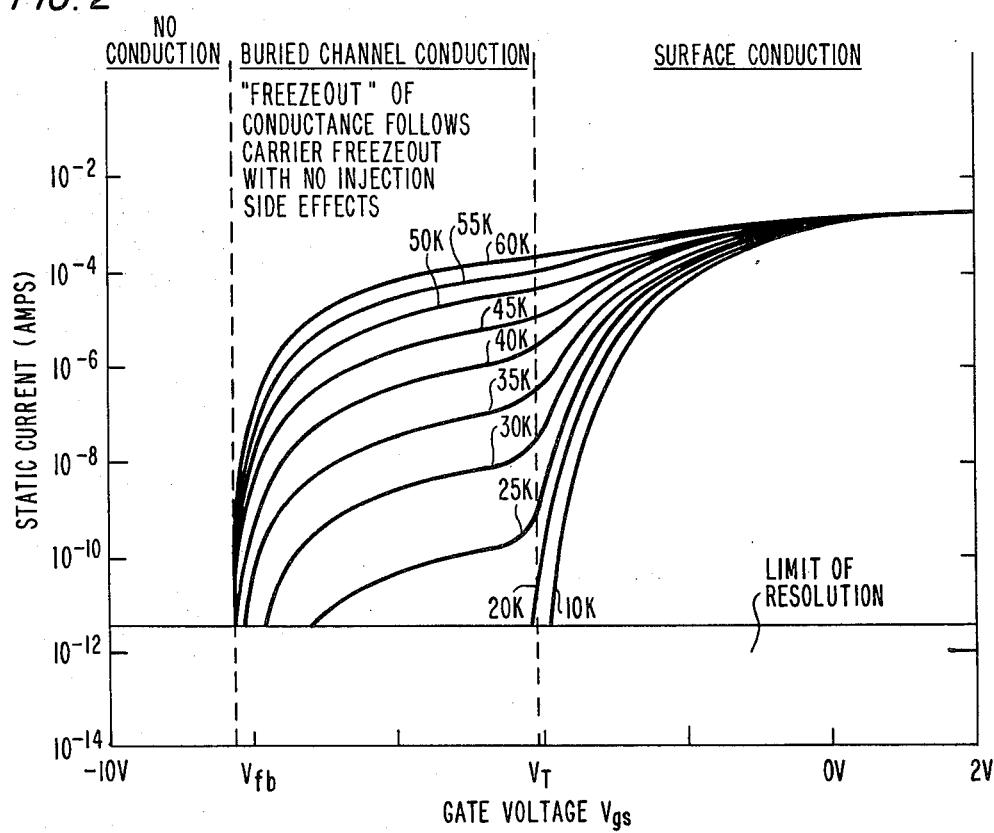
FIG. 2 is an approximate graphic representation of the experimentally measured static current within the buried channel and surface channel regions of the device of FIG. 1 with changing voltage bias on the gate.

In the graph of FIG. 2, the ordinate represents the static source current $I_{ds}$ of the MOSFET 11 in amperes, while the abscissa represents the gate bias voltage $V_{gs}$ in volts. A low static conductance is desirable because, among other things, it reduces dc power and sensitivity to static biases. Each of the plotted curves is representative of the current for the given temperature. It can be seen that at lower temperatures there is a dramatic drop of the current in the channel region 30 due to carrier freezeout. At less than about 10 degrees Kelvin this current is insignificant, up to the threshold voltage $V_t$ for surface conduction for the device 10. The flatband voltage $V_{fb}$ in FIG. 2 is the gate bias threshold for formation of the buried channel 30 (i.e. $W_{bc} > 0$ in FIG. 1). For the non-equilibrium switching discussed here, the device would be biased at $V_{fb} << V_{gs} << V_t$, and to allow zero absolute voltages, at $V_{fb} << V_{gs} = 0 << V_t$. Such values of $V_{fb}$ and $V_t$ can be achieved by known methods during MOSFET fabrication for threshold voltage adjustment.

The width $W_s$ of the surface depletion region 36 and the width $W_b$ of the interior depletion region 38 depend on the Fermi energy level (and therefore on temperature) in the channel region 30 and in the substrate 12. They therefore increase somewhat with decreasing temperature, and in so doing reduce at a given set of bias voltages the width $W_{bc}$ of the buried channel 40. However, the FIG. 2 shows that this gives only a small shift (compared to the operating range $V_t - V_{fb}$) in the threshold voltage $V_t$ with temperature. FIG. 2 suggests that the static current in the buried channel 40 varies with temperature as does the carrier density, and that there are no pronounced carrier injection effects present which produce significant increases in the static conductance of the buried channel 40.

Figure 3:
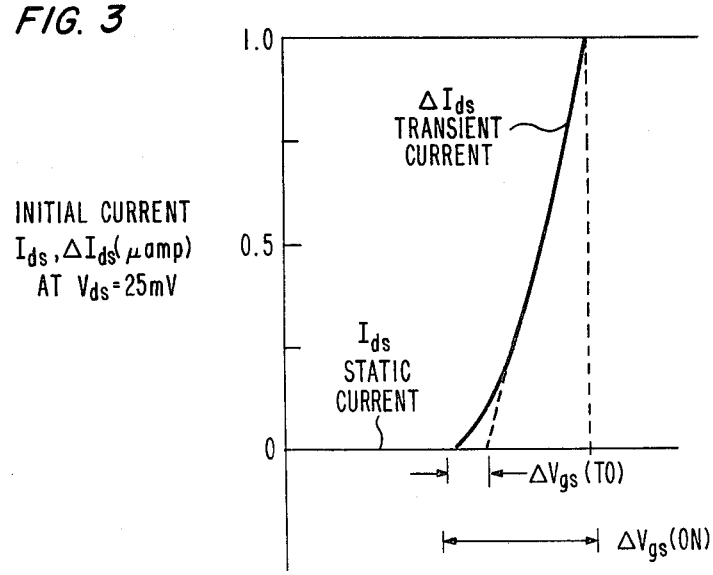
FIG. 3 is a more detailed representation of the initial current rise of the transient current shown in the box 44 of FIG. 1.

The expected transient current response to the switching pulse $\Delta V_{gs}$, which is shown schematically in the box 44 of FIG. 1, is shown in more detail in the graph of FIG. 3. The ordinate represents the initial transient current amplitude $\Delta I_{ds}$ in microamperes with $V_{ds} = 25$ mv. The abscissa represents increasing gate bias pulse voltage amplitude $\Delta V_{gs}$. This transient conductivity provides a mechanism for a dynamic switching device. Dynamic and low temperature operation are each formidable obstacles to practical application in logic circuits. On the other hand, the high speed of less than about one nanosecond and low power of less than about one nanowatt expected at $V_{ds} = 25$ mvolt, $\Delta I_{ds} = 1$ $\mu$amp perhaps offset these obstacles, which can be regarded alternatively as necessary conditions for lower voltage swings of about 25 millivolts or less.

Major practical limits have previously prohibited low voltage swing of VLSI field-effect semiconductor logic devices, even at low temperatures. Three general properties of the device 10 satisfy the conditions which seem to apply for low voltage VLSI MOSFET devices. (1) The low static transconductance removes limits due to steady state bias and threshold voltage uncertainties. (2) The dynamic transconductance of the MOSFET 11 provides about 1 microampere current at $\Delta V_{gs}(ON) = 25$ millivolt and $V_{ds} = 25$ millivolt. This current level is consistent with the static transconductance models of conventional MOSFET's with an aspect ratio of 1:5 and the higher mobilities obtained at lower temperature. (3) Finally, locating the buried channel 40 away from the interface of the insulator 28 and the semiconductor 12 seems necessary to relax the limits due to surface states, surface potential nonuniformities, and percolation effects, and to surface quantization which would otherwise prevent achievement of a sharp turn-on, i.e., small $\Delta V_{gs}(TO)$. The transient conductivity effects previously reported for conventional MOSFET's are static, surface conductance effects and generally require large voltage pulses on the gate for reliable VLSI circuits. Therefore, they do not satisfy the above three conditions. However, the transient conductivity in a buried channel MOSFET structure such as the MOSFET 11, does allow low voltage switching.

The temperature at which carrier freezeout begins to predominate in a doped semiconductor varies with the particular dopant used. There may be a number of other dopants, such as dopants with an energy band level which is deep relative to that of boron, which will provide a freezeout condition at temperatures much higher than 30 degrees Kelvin. For example, it has been found that when tellurium is used as the dopant, there is carrier freezeout at temperatures above 77 degrees Kelvin. This is of particular practical significance, since devices may be readily maintained at such temperatures solely with the use of boiling liquid nitrogen at standard temperature and pressure. Specifically, the tellurium was ion-implanted at 150,000 electron volts (150 KeV) into the 10 ohm-centimeter resistivity Czochralski-grown silicon substrate 12 with a $5 \times 10^{12}$ atoms per square centimeter dose. This was done before the formation of the oxide insulating layer 28 through the opening or "window" which defines the area on which the oxide insulating layer 28 is to be grown during the fabrication process of the MOSFET. The implanted substrate 12 was annealed at 900 degrees centigrade in a nitrogen ambient for 30 minutes. The oxide insulating layer 28 was then grown at 1050 degrees centigrade for 45 minutes and the structure annealed again in nitrogen for 15 minutes at 1050 degrees centigrade. Thereafter, the aluminum gate electrode 26 was formed and the device was tempered for 30 minutes in forming gas at 450 degrees centigrade. Therefore, the present invention relates not so much to a particular temperature or temperature range as to the establishment of a carrier freezeout condition in the switching device which is sufficiently dominant to permit useful switching functions.

The dynamic input to the switching device in accordance with the invention is a pulsed field in a channel region. The mechanism for providing this pulsing of the field need not necessarily involve an insulated gate structure, as is the case for a MOSFET, but can be any other convenient means for providing such field pulsing.

What is claimed is:

1. A field-effect solid state device, comprising:
   a semiconductor body having a first conductivity type first region contiguous with a second conductivity type second region to form a P-N junction therebetween;
   means for establishing a majority carrier freezeout condition within at least said first region;
   means for generating within said body an electric field generally perpendicular to said P-N junction to form a buried conduction channel in said first region;
   means for making contact to said body at opposite ends of the buried channel, and
   means for pulsing the strength of said field,
   whereby a transient conductive path is generated in the buried channel between said contact means in response to the pulsing.

2. The device defined in claim 1 wherein said means for making contact comprise a pair of mutually-spaced conductive contact regions of the first conductivity type in the surface of said body and extending into it.

3. The device defined in claim 2 wherein said means for generating an electric field comprise a first electrode adjacent said first region and a second electrode adjacent said second region.

4. The device defined in claim 3 wherein said first electrode comprises a gate electrode separated from said first region by an insulating layer.

5. The device defined in claim 4 wherein said second electrode comprises a conducting layer of said second conductivity type in the surface of said second region and a metal layer on this conducting layer.

6. The device defined in claim 5 wherein said means for establishing freezeout comprise means for cooling said body.

7. A high speed electronic switching device, comprising:
   a buried-channel field-effect transistor, having a channel region, two spaced apart contact regions, a gate electrode, and a substrate bias electrode;
   means for establishing a majority carrier freezeout condition within at least said channel region,
   means for establishing bias voltages on said electrodes such that a buried channel is formed in said channel region between said contact regions, and
   means for applying a switching voltage pulse to said gate electrode,
   whereby a transient conductive path between said contact regions is formed in said channel region in response to said pulse.

8. The device defined in claim 7 wherein said means for establishing freezeout comprise means for cooling said transistor.

9. A method of operating a buried-channel field-effect transistor, comprising:
   cooling the transistor sufficiently to establish a majority carrier freezeout in its channel region;
   applying bias voltages to the gate and the substrate bias electrode of the transistor such that a buried-channel is formed in the channel region;
   applying switching voltage pulses to the gate of the transistor,
   whereby a transient conductive path is generated between the source and drain of the transistor through the buried-channel in response to the switching pulses.

10. The method defined in claim 9 wherein said cooling is to a temperature of less than about 30 degrees Kelvin.

11. The device defined in claim 1, wherein said semiconductor body comprises a dopant having a relatively deep energy band level.

12. The device defined in claim 11, wherein said semiconductor body is silicon and said dopant is tellurium.

13. The device defined in claim 12, wherein said dopant is ion-implanted with a dose of about $5 \times 10^{12}$ atoms per square centimeter.

* * * * *

UNITED STATES PATENT AND TRADEMARK OFFICE
CERTIFICATE OF CORRECTION

PATENT NO. : 4,472,727
DATED : September 18, 1984
INVENTOR(S) : Stuart K. Tewksbury It is certified that error appears in the above-identified patent and that said Letters Patent is hereby corrected as shown below:

Column 1, line 25, "100" should read --10--.

Signed and Sealed this

Tenth Day of December 1985

[SEAL]

Attest:

Attesting Officer

DONALD J. QUIGG

Commissioner of Patents and Trademarks